(12) United States Patent
Wang et al.

(10) Patent No.: US 10,811,380 B2
(45) Date of Patent: *Oct. 20, 2020

(54) SEMICONDUCTOR STRUCTURE AND FORMING METHOD THEREOF

(71) Applicant: Yangtze Memory Technologies Co., Ltd., Wuhan, Hubei Province (CN)

(72) Inventors: Xinsheng Wang, Wuhan (CN); Li Zhang, Wuhan (CN); Gaosheng Zhang, Wuhan (CN); Xianjin Wan, Wuhan (CN); Ziqun Hua, Wuhan (CN); Jiawen Wang, Wuhan (CN); Taotao Ding, Wuhan (CN); Hongbin Zhu, Wuhan (CN); Weihua Cheng, Wuhan (CN); Shining Yang, Wuhan (CN)

(73) Assignee: Yangtze Memory Technologies Co., Ltd., Wuhan, Hubei Province (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/377,241

(22) Filed: Apr. 7, 2019

(65) Prior Publication Data

US 2020/0006277 A1  Jan. 2, 2020

Related U.S. Application Data

(63) Continuation of application No. PCT/CN2018/093693, filed on Jun. 29, 2018.

(51) Int. Cl.
*H01L 23/52* (2006.01)
*H01L 23/00* (2006.01)
*H01L 23/532* (2006.01)

(52) U.S. Cl.
CPC .......... *H01L 24/33* (2013.01); *H01L 23/5329* (2013.01); *H01L 24/09* (2013.01); *H01L 24/27* (2013.01); *H01L 2224/335* (2013.01)

(58) Field of Classification Search
CPC ..... H01L 23/5329; H01L 24/33; H01L 24/09; H01L 24/27
(Continued)

(56) References Cited

U.S. PATENT DOCUMENTS 8,368,222 B2 * 2/2013 Okuyama .......... H01L 23/53238
257/758
8,896,125 B2 * 11/2014 Kagawa ................ H01L 23/528
257/774
(Continued)

FOREIGN PATENT DOCUMENTS

CN 103839800 A * 6/2014
TW 201546874 A 12/2015
TW 201705192 A 2/2017

*Primary Examiner* — Luan C Thai
(74) *Attorney, Agent, or Firm* — Winston Hsu

(57) ABSTRACT

The present invention relates to a semiconductor structure and a manufacturing method thereof. The semiconductor structure includes: a first substrate; a first adhesive layer disposed on a surface of the first substrate; and a first bonding layer disposed on a surface of the first adhesive layer. A density of the first adhesive layer is greater than a density of the first bonding layer. The first adhesive layer of the semiconductor structure has higher adhesion with the first substrate and first bonding layer, such that it is advantageous to improve a performance of the semiconductor structure.

16 Claims, 3 Drawing Sheets

(58) Field of Classification Search
USPC .......................................................... 257/734
See application file for complete search history.

(56) References Cited

U.S. PATENT DOCUMENTS

| | | | | |
|---|---|---|---|---|
| 9,520,361 | B2* | 12/2016 | Kang | ................. H01L 24/08 |
| 9,941,243 | B2* | 4/2018 | Kim | ................. H01L 25/0657 |
| 2016/0276200 | A1 | 9/2016 | Shirakawa | |
| 2016/0358828 | A1 | 12/2016 | Ide | |

* cited by examiner

SEMICONDUCTOR STRUCTURE AND FORMING METHOD THEREOF

CROSS REFERENCE TO RELATED APPLICATIONS

This patent application is a continuation of International Application PCT/CN2018/093693, filed Jun. 29, 2018. The present application is based on and claims priority to International Application PCT/CN2018/093693 filed on Jun. 29, 2018, the contents of which are hereby incorporated by reference in their entirety.

BACKGROUND OF THE INVENTION

1. Field of the Invention

The present invention relates to a field of semiconductor technology, and more particularly to a semiconductor structure and forming method thereof.

2. Description of the Prior Art

In 3D chip technology, two or more wafers on which semiconductor elements are formed are usually bonded by wafer bonding technology to improve the integration of the chip. In the existing wafer bonding technology, a bonding film is formed on a bonding surface of the wafer, and two wafers are bonded through the bonding film, so as to realize the wafer bonding.

In the existing technology, a film made of silicon oxide and/or silicon nitride is used as the bonding film, but the bonding strength of the bonding film is not enough, such that defects are easily generated in the forming process, and then the yield of the product is affected.

Also, a metal connection structure is further formed in the bonding film, and a diffusion phenomenon of the metal connection structure easily occurs at the bonding interface in the hybrid bonding process, so as to influence the performance of the product.

Thus, how to improve the quality of the wafer bonding is an urgent problem to be solved.

SUMMARY OF THE INVENTION

A technical problem to be solved by the present invention is to provide a semiconductor structure and a forming method thereof for improving bonding quality.

In order to solve the above problem, the present invention provides a semiconductor structure including: a first substrate; a first adhesive layer disposed on a surface of the first substrate; and a first bonding layer disposed on a surface of the first adhesive layer, wherein a density of the first adhesive layer is greater than a density of the first bonding layer.

Optionally, the first bonding layer includes a dielectric material including carbon (C).

Optionally, the first bonding layer further includes silicon (Si) and nitrogen (N).

Optionally, the first adhesive layer includes at least one of silicon nitride, silicon oxynitride and silicon oxide.

Optionally, a thickness of the first adhesive layer ranges from 30 Å to 100 Å.

Optionally, an atomic concentration of the carbon is uniform in the first bonding layer, or the atomic concentration of the carbon is increased as a thickness of the first bonding layer is increased.

Optionally, the semiconductor structure further includes a second substrate, wherein a second adhesive layer and a second bonding layer disposed on a surface of the second adhesive layer are formed on a surface of the second substrate, a density of the second adhesive layer is greater than a density of the second bonding layer, and a surface of the second bonding layer and a surface of the first bonding layer face each other for being bonded.

Optionally, the second bonding layer and the first bonding layer have a same material, and the second adhesive layer and the first adhesive layer have a same material.

Optionally, a thickness of the second adhesive layer ranges from 30 Å to 100 Å.

Optionally, the semiconductor structure further includes: a first bonding pad extending through the first bonding layer and the first adhesive layer; and a second bonding pad extending through the second bonding layer and the second adhesive layer; wherein the first bonding pad and the second bonding pad are correspondingly bonded and connected to each other.

In order to solve the above problem, the present invention further provides a forming method of a semiconductor structure, including: providing a first substrate; forming a first adhesive layer on a surface of the first substrate; performing a plasma bombardment process to the first adhesive layer, so as to enhance a density of the first adhesive layer; and forming a first bonding layer on a surface of the first adhesive layer, wherein the density of the first adhesive layer is greater than a density of the first bonding layer.

The first adhesive layer has hydrogen (H) bonds before performing the plasma bombardment process; in addition, a nitrogen plasma is used for bombarding to decrease hydrogen bonds of the first adhesive layer in the step of performing the plasma bombardment process.

Optionally, the first bonding layer includes a dielectric material including carbon.

Optionally, the first bonding layer further includes silicon and nitrogen.

Optionally, the first adhesive layer includes at least one of silicon nitride, silicon oxynitride and silicon oxide.

Optionally, a thickness of the first adhesive layer ranges from 30 Å to 100 Å.

In the semiconductor structure of the present invention, the first adhesive layer is disposed between the first substrate and the first bonding layer, and the density of the first adhesive layer is greater than the density of the first bonding layer, which enhance the adhesive force between the first adhesive layer and the first bonding layer. Also, after bonding the first bonding layer, the bonding surface has greater bonding force, so as to block the diffusion of metal material at the bonding interface and improve the performance of the semiconductor structure.

DETAILED DESCRIPTION

Embodiments of a semiconductor structure and a forming method thereof provided by the present invention are described in the following detailed description, taken in conjunction with the drawings as described below.

Referring to FIG. 1 to FIG. 4, FIG. 1 to FIG. 4 are structure schematic diagrams of a forming process of a semiconductor structure according to an embodiment of the present invention.

Figure 1:
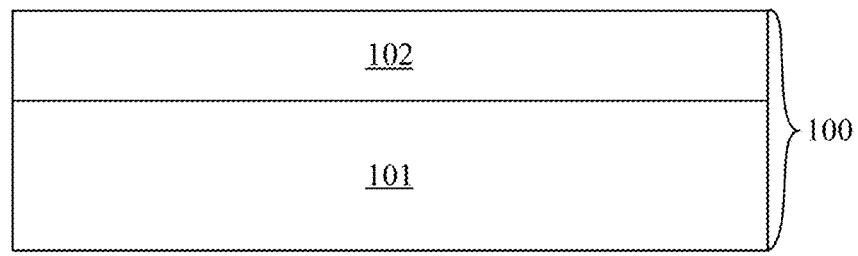
FIG. 1 to FIG. 4 are structure schematic diagrams of a forming process of a semiconductor structure according to an embodiment of the present invention.

Referring to FIG. 1, a first substrate 100 is provided.

The first substrate 100 includes a first semiconductor substrate 101, and a first component layer 102 formed on a surface of the first semiconductor substrate 101.

The first semiconductor substrate 101 may be a monocrystalline silicon substrate, a germanium (Ge) substrate, a silicon germanium (SiGe) substrate, SOI (silicon on insulator) or GOI (germanium on insulator), etc.; the suitable substrate may be selected for being the first semiconductor substrate 101 according to actual requirements of the components, and the first semiconductor substrate 101 is not limited here. In this embodiment, the first semiconductor substrate 101 is a monocrystalline silicon wafer.

The first component layer 102 includes a semiconductor component forming on the first semiconductor substrate 101, a metal interconnection structure connected to the semiconductor component, and a dielectric layer covering the semiconductor component and the metal interconnection structure, etc., and the dielectric layer is generally silicon oxide, silicon nitride or silicon oxynitride. The first component layer 102 may be a multi-layer structure or a single-layer structure. In an embodiment, the first component layer 102 includes the dielectric layer and a 3D NAND structure formed in the dielectric layer.

Figure 2:
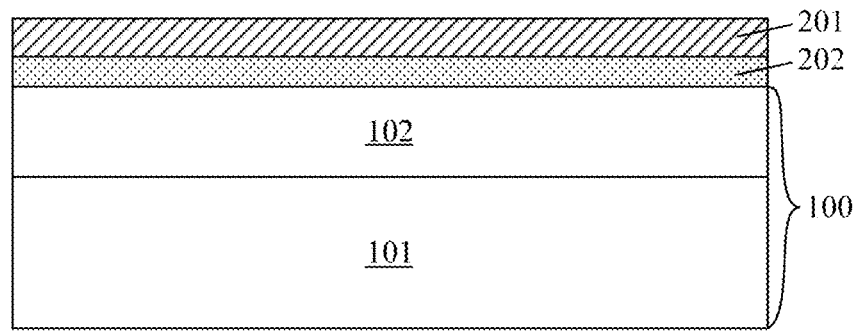

Referring to FIG. 2, a first adhesive layer 202 and a first bonding layer 201 on a surface of the first adhesive layer 202 are formed on a surface of the first substrate 100.

The first adhesive layer 202 and the first bonding layer 201 may be sequentially formed by a chemical vapor deposition process. In this embodiment, the first adhesive layer 202 and the first bonding layer 201 are formed by a plasma enhanced chemical vapor deposition process.

The material of the first adhesive layer 202 is a dielectric material of which a density is greater than a density of the first bonding layer 201. The first adhesive layer 202 may include at least one of silicon nitride, silicon oxynitride and silicon oxide, and furthermore, based on reaction gas in the chemical vapor deposition process and requirements of the product, the first adhesive layer 202 may be doped with at least one of oxygen (O), hydrogen (H), phosphours (P) and fluorine (F), etc.

In an embodiment, the material of the first adhesive layer 202 is silicon nitride, the first adhesive layer 202 is formed by the plasma enhanced chemical vapor deposition process, the reaction gas used in this process includes $SiH_4$ and $NH_3$, a flow ratio between $SiH_4$ and $NH_3$ is in a range of (0.8~1.2):1, and a radio frequency (RF) power ranges from 150 W to 300 W. The first adhesive layer 202 with higher density may be formed through adjusting process parameters in the deposition process.

In another embodiment, the forming method of the first adhesive layer 202 includes: forming an adhesive material layer on the surface of the first substrate 100 by the deposition process, and then, performing a plasma bombardment process to the adhesive material layer to decrease the content of hydrogen in the adhesive material layer, such that the density of the first adhesive layer 202 is enhanced. The plasma bombardment process may utilize a gas containing nitrogen (N), such as $N_2$, $NH_3$, etc. In an embodiment, the plasma bombardment process may use $N_2$ to be a plasma source with a radio frequency (RF) power ranging from 300 W to 800 W and a bombardment time of longer than 15 seconds. The hydrogen (H) in the first adhesive layer 202 may be removed by the plasma bombardment process, such that a unit area of the first adhesive layer 202 has more chemical bonds, such as Si— and N—, etc., for being connected to an adjacent material layer, so as to enhance adhesive force of an interface between the first adhesive layer 202 and the first bonding layer 201.

The first bonding layer 201 includes a dielectric material including carbon (C), and the first bonding layer 201 in an embodiment mainly includes silicon (Si), nitrogen (N) and carbon (C). In another embodiment, based on reaction gas in the chemical vapor deposition process and requirements of the product, the first bonding layer 201 may be doped with at least one of silicon (Si), nitrogen (N), oxygen (O), hydrogen (H), phosphours (P) and fluorine (F), etc. The material of the first bonding layer 201 may be silicon nitride doped with carbon, silicon oxynitride doped with carbon or silicon oxide doped with nitrogen and carbon, etc. Because the first bonding layer 201 includes carbon, the density of the first bonding layer 201 is lower, and thus, if the first bonding layer 201 is directly formed on the surface of the first substrate 100, adhesive force between the first bonding layer 201 and the surface of the first substrate 100 is weaker. In the embodiment of the present invention, the first adhesive layer 202 with higher density is formed between the first bonding layer 201 and the first substrate 100, such that the adhesive forces between each two layers may be enhanced.

In an embodiment, the first bonding layer 201 is formed by the plasma enhanced chemical vapor deposition process, the reaction gas used in the deposition process includes: $NH_3$ and one of trimethylsilane and tetramethylsilane, a flow ratio between trimethylsilane and $NH_3$ or a flow ratio between tetramethylsilane and $NH_3$ are in a range of (1.6~2.4):1, and a radio frequency (RF) power ranges from 500 W to 1100 W. By controlling the forming process parameters of the first bonding layer 201 and the first adhesive layer 202, the concentrations of each material component in the first bonding layer 201 and the first adhesive layer 202 may be adjusted, so as to adjust the adhesive force between material layers and the dielectric constant of the first bonding layer 201.

The carbon (C) in the first bonding layer 201 can effectively improve a bonding force between the first bonding layer 201 and another bonding layer during a bonding process. If the concentration of the carbon (C) is higher, the bonding force between the first bonding layer 201 and another bonding layer is greater. In an embodiment, the atomic concentration of the carbon (C) in the first bonding layer 201 is greater than 0 and less than 50%; in another embodiment, the atomic concentration of the carbon (C) in the first bonding layer 201 is greater than 35%.

Since the adhesive force between the different material layers is correlated to the material components of two sides of the interface, when the material components are closer, the adhesive force is stronger. In order to further enhance the adhesive force between the first adhesive layer 202 and the first component layer 102, the process parameters may be adjusted gradually during the formation of the first adhesive layer 202, such that the concentration of the material component in the first adhesive layer 202 may be changed gradually, and the material components of two sides of the interface between the first component layer 102 and the first adhesive layer 202 are closer. In an embodiment, during the formation of the first adhesive layer 202, as the thickness of the first adhesive layer 202 is increased, by adjusting the process parameters of the deposition process, the atomic concentration of silicon (Si) in the first adhesive layer 202 is gradually changed as the thickness of the first adhesive layer 202 is increased. In another embodiment, the concentration of other components in the first adhesive layer 202 may be adjusted depending on the difference of the material of the surface of the first component layer 102. In another embodiment, it is also possible to keep the process parameters of the deposition process unchanged during the formation of the first adhesive layer 202, such that the atomic concentration of each element in the first adhesive layer 202 is unchanged at different thickness location.

In order to further enhance the adhesive force between the first adhesive layer 202 and the first bonding layer 201, the process parameters may be adjusted gradually during the formation of the first bonding layer 201, such that the concentration of the material component in the first bonding layer 201 may be changed gradually, and the material components of two sides of the interface between the first bonding layer 201 and the first adhesive layer 202 are closer. In an embodiment, during the formation of the first bonding layer 201, as the thickness of the first bonding layer 201 is increased, by adjusting the process parameters of the deposition process, the atomic concentration of carbon (C) in the first bonding layer 201 is gradually increased as the thickness of the first bonding layer 201 is increased. In another embodiment, the atomic concentration of carbon (C) in the first bonding layer 201 may be gradually deceased as the thickness of the first bonding layer 201 is increased, or the atomic concentration of carbon (C) in the first bonding layer 201 may be gradually increased and then gradually decreased as the thickness of the first bonding layer 201 is increased. In another embodiment, during the formation of the first bonding layer 201, the process parameters of the deposition process are unchanged, so as to keep the atomic concentration of each element in the first bonding layer 201 consistent at different thickness location.

In order to keep the first adhesive layer 202 having higher density, during the formation of the first adhesive layer 202, the hydrogen (H) in the first adhesive layer 202 may be reduced as much as possible in the ion bombardment process, such that the density of the first adhesive layer 202 at each thickness location is enhanced, and the thickness of the first adhesive layer 202 cannot be too thick. In an embodiment, the thickness of the first adhesive layer 202 ranges from 30 Å to 100 Å.

The thickness of the first bonding layer 201 is greater than the thickness of the first adhesive layer 202, so as to ensure that the first bonding layer 201 has enough bonding thickness when bonding the first bonding layer 201 and another bonding layer. The thickness of the first bonding layer 201 is greater than 100 Å.

In another embodiment, the first bonding layer 201 may further include two or more stacked sub-bonding layers. The materials of the different sub-bonding layers may be a same or different.

In the semiconductor structure of the above embodiment, the first adhesive layer is disposed between the first substrate and the first bonding layer, and the density of the first adhesive layer is greater than the density of the first bonding layer, which enhance the adhesive force between the first adhesive layer and the first bonding layer. Also, after bonding the first bonding layer, the bonding surface has greater bonding force, so as to block the diffusion of metal material at the bonding interface and improve the performance of the semiconductor structure.

Figure 3:
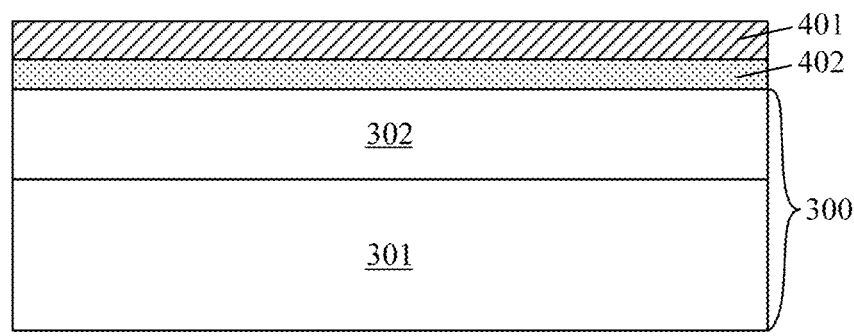

Referring to FIG. 3, in another embodiment, the forming process of a semiconductor structure further includes: providing a second substrate 300; and forming a second adhesive layer 402 and a second bonding layer 401 disposed on a surface of the second adhesive layer 402 on a surface of the second substrate 300.

The second substrate 300 includes a second semiconductor substrate 301 and a second component layer 302 disposed on a surface of the second semiconductor substrate 301.

The material of second adhesive layer 402 is a dielectric material of which a density is greater than a density of the second bonding layer 401. The first adhesive layer 202 may include at least one of silicon nitride, silicon oxynitride and silicon oxide, and furthermore, based on reaction gas in the chemical vapor deposition process and requirements of the product, the first adhesive layer 202 may be doped with at least one of oxygen (O), hydrogen (H), phosphours (P) and fluorine (F), etc.

The second bonding layer 401 includes a dielectric material including carbon (C), and the second bonding layer 401 in an embodiment mainly includes silicon (Si), nitrogen (N) and carbon (C). In another embodiment, based on reaction gas in the chemical vapor deposition process and requirements of the product, the second bonding layer 401 may be doped with at least one of silicon (Si), nitrogen (N), oxygen (O), hydrogen (H), phosphours (P) and fluorine (F), etc.

The second adhesive layer 402 and the second adhesive layer 401 may be sequentially formed on a surface of the second component layer 302 by a chemical vapor deposition process. The materials and structures of the second adhesive layer 402 and the second bonding layer 401 may be similar to those in the description of the first adhesive layer 202 and the first bonding layer 201 in the above embodiments, and will not be redundantly described. In an embodiment, the second adhesive layer 402 and the first adhesive layer 202 have the same material and structure; the second bonding layer 401 and the first bonding layer 201 have the same material and structure. The thickness of the second adhesive layer 402 ranges from 30 Å to 100 Å, and the thickness of the second bonding layer 401 is greater than 100 Å.

Figure 4:
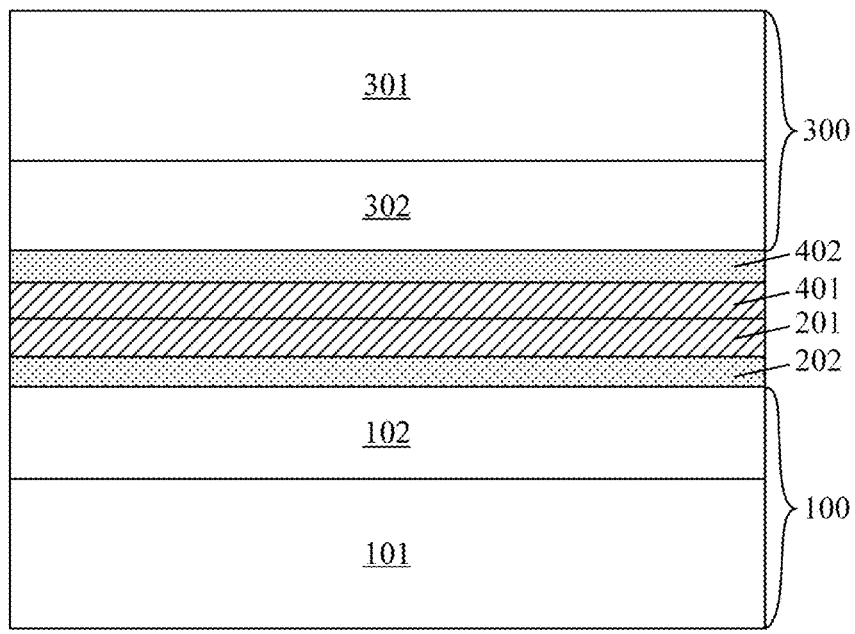

Referring to FIG. 4, a surface of the second bonding layer 401 and a surface of the first bonding layer 201 face each other for being bonded.

The second bonding layer 401 and the first bonding layer 201 include carbon (C), a portion of carbon exists in a form of —$CH_3$, and —$CH_3$ is easier to be oxidized to —OH and then forms Si—O bond during bonding, such that more Si—O bonds may be formed at the bonding interface to generate stronger bonging force. In an embodiment, the bonding force between the second bonding layer 401 and the first bonding layer 201 is greater than 2 $J/M^2$. In the prior art, bonding process is performed using a bonding layer without carbon, and the bonding force is normally less than 1.5 $J/M^2$.

In an embodiment, the first substrate 100 is a substrate on which a 3D NAND memory structure is formed, and the second substrate 200 is a substrate on which a peripheral circuit is formed.

In another embodiment, the above adhesive layer and bonding layer may be further formed on both side surfaces of the substrate, so as to realize multilayer bonding.

Figure 5:
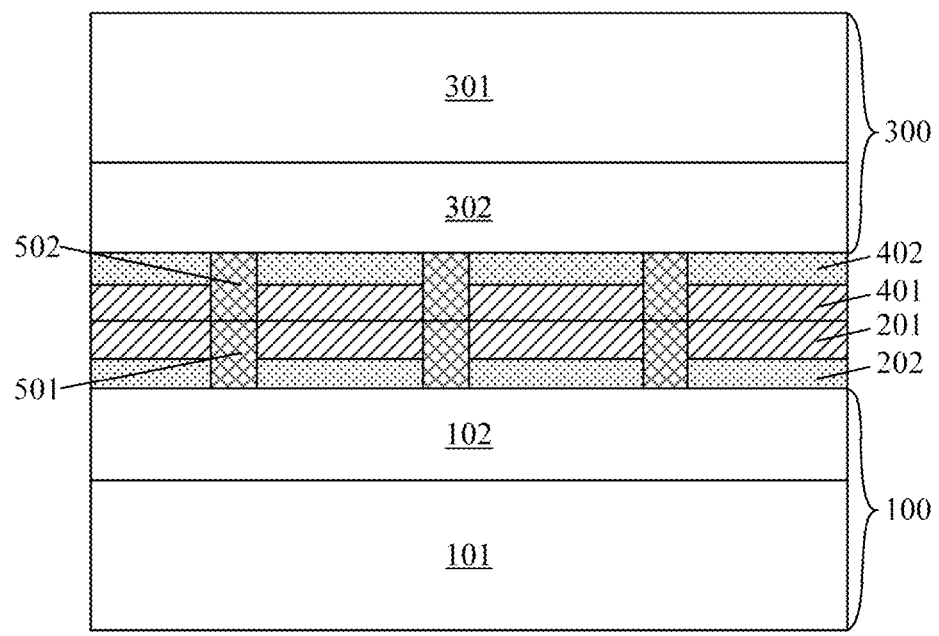
FIG. 5 is a structure schematic diagram of a semiconductor structure according to an embodiment of the present invention.

Referring to FIG. 5, in another embodiment, the forming process of a semiconductor structure further includes: forming a first bonding pad 501 extending through the first bonding layer 201 and the first adhesive layer 202; forming a second bonding pad 502 extending through the second bonding layer 401 and the second adhesive layer 402; when bonding the surface of the second bonding layer 401 and the surface of the first bonding layer 201 facing each other, correspondingly bonding the first bonding pad 501 and the second bonding pad 502 to be connected to each other.

The first bonding pad 501 and the second bonding pad 502 may be respectively connected to the semiconductor components or metal interconnection layers in the first component layer 102 and the second component layer 302.

The forming method of the first bonding pad 501 includes: patterning the first bonding layer 201 and the first adhesive layer 202 to form an opening penetrating the first bonding layer 201 and the first adhesive layer 202; filling a metal material in the opening and performing planarization process, so as to form the first bonding pad 501 filled in the opening. The second bonding pad 502 is formed in the second bonding layer 401 and the second adhesive layer 402 by the same method. The first bonding pad 501 and the second bonding pad 502 are bonded to be connected each other, such that the electrical connection between the semiconductor components in the first component layer 102 and the second component layer 302 may be realized.

The first bonding pad 501 and the second bonding pad 502 may include metal material such as copper (Cu), tungsten (W), etc. The first bonding layer 201 and the second bonding layer 401 include carbon (C) which can block the diffusion of the material of the first bonding pad 501 and the second bonding pad 502 at the bonding interface and improve the performance of the semiconductor structure.

In the above embodiment, the adhesive layer is formed on the surface of the substrate, the bonding layer is formed on the surface of the adhesive layer, and the density of the adhesive layer is greater than the density of the bonding layer, so as to enhance the adhesive force between the adhesive layer and the bonding layer. After bonding the bonding layer, the bonding surface has greater bonding force, so as to block the diffusion of metal material at the bonding interface and improve the performance of the semiconductor structure.

The forming method of the semiconductor structure of the above embodiment may be configured to bond a plurality of substrates.

Figure 6:
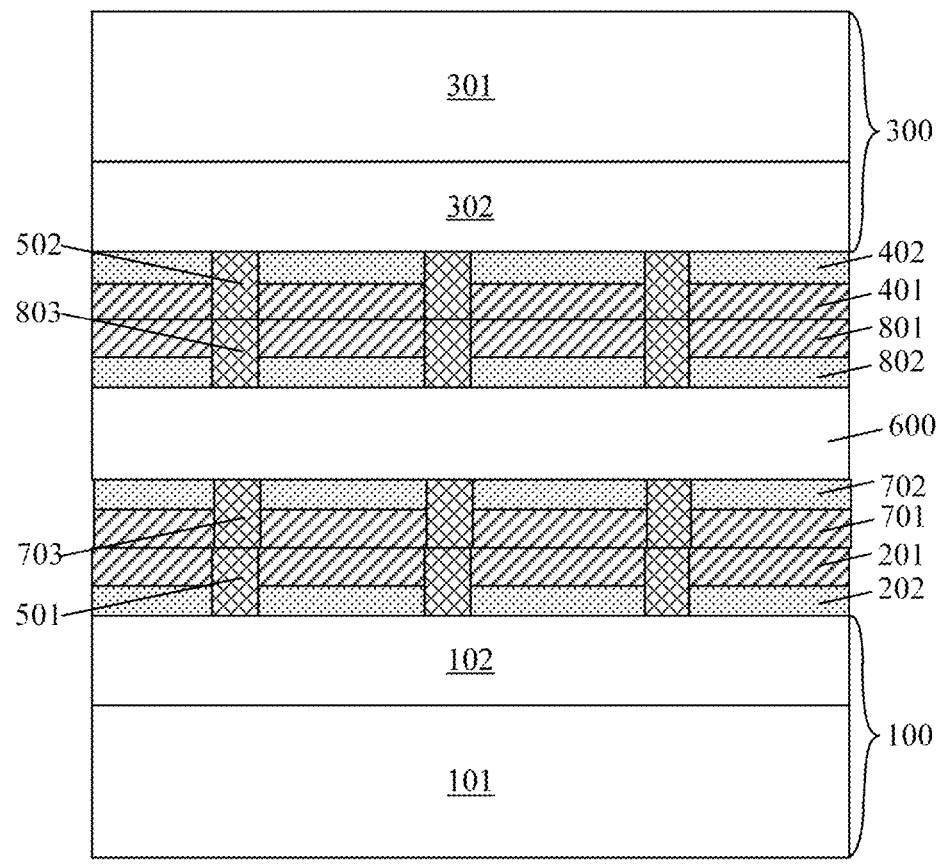
FIG. 6 is a structure schematic diagram of a semiconductor structure according to an embodiment of the present invention.

Referring to FIG. 6, in an embodiment of the present invention, the forming method of the semiconductor structure further includes: providing a third substrate 600, sequentially forming a third adhesive layer 702 and a third bonding layer 701 on a surface of a side of the third substrate 600, and sequentially forming a fourth adhesive layer 802 and a fourth bonding layer 801 on a surface of another side opposite to the aforementioned side of the third substrate 600; and bonding a surface of the third bonding layer 701 and a surface of the first bonding layer 201 facing each other, and bonding a surface of the fourth bonding layer 801 and a surface of the second bonding layer 401 facing each other, so as to form a three-layer bonding structure.

The forming method of the third adhesive layer 702 and the fourth adhesive layer 802 may be similar to the forming method of the first adhesive layer 202 in the above embodiments, and will not be redundantly described. The forming method of the third bonding layer 701 and the fourth bonding layer 801 may be similar to the forming method of the first bonding layer 201 in the above embodiments, and will not be redundantly described.

In this embodiment, the forming method of the semiconductor structure further includes: forming a third bonding pad 703 extending through the third bonding layer 701 and the third adhesive layer 702, forming a fourth bonding pad 803 extending through the fourth bonding layer 801 and the fourth adhesive layer 802, bonding the third bonding pad 703 and the first bonding pad 501 to be connected to each other, and bonding the fourth bonding pad 803 and the second bonding pad 502 to be connected to each other.

In another embodiment, a bonding structure having four or more layers may be formed by the above method.

It is to note that, in the present invention, the type of the semiconductor component disposed in each substrate of the semiconductor structure should not be limited to the above embodiment; besides the 3D NAND, the semiconductor component may be a CMOS circuit, a CIS circuit or a TFT circuit, etc.

An embodiment of the present invention further provides a semiconductor structure.

Referring to FIG. 2, FIG. 2 is a structure schematic diagram of the semiconductor structure according to an embodiment of the present invention.

The semiconductor structure includes: the first substrate 100; the first adhesive layer 202 disposed on the surface of the first substrate 100; and the first bonding layer 201 disposed on the surface of the first adhesive layer 202.

The first substrate 100 includes the first semiconductor substrate 101, and the first component layer 102 formed on the surface of the first semiconductor substrate 101.

The first semiconductor substrate 101 may be a monocrystalline silicon substrate, a germanium (Ge) substrate, a silicon germanium (SiGe) substrate, SOI (silicon on insulator) or GOI (germanium on insulator), etc.; the suitable substrate may be selected for being the first semiconductor substrate 101 according to actual requirements of the components, and the first semiconductor substrate 101 is not limited here. In this embodiment, the first semiconductor substrate 101 is a monocrystalline silicon wafer.

The first component layer 102 includes a semiconductor component formed on the first semiconductor substrate 101, a metal interconnection structure connected to the semiconductor component, and a dielectric layer covering the semiconductor component and the metal interconnection structure, etc. The first component layer 102 may be a multi-layer structure or a single-layer structure. In an embodiment, the first component layer 102 includes the dielectric layer and a 3D NAND structure formed in the dielectric layer.

The material of the first adhesive layer 202 is the dielectric material of which the density is greater than the density of the first bonding layer 201. The first adhesive layer 202 may include at least one of silicon nitride, silicon oxynitride and silicon oxide, and based on the reaction gas used in the chemical vapor deposition process and requirements of the product, the first adhesive layer 202 may be doped with at least one of oxygen (O), hydrogen (H), phosphours (P) and fluorine (F), etc. In an embodiment, the first adhesive layer 202 is silicon nitride (SiN) with high density.

The first bonding layer 201 includes the dielectric material including carbon (C), and the first bonding layer 201 in an embodiment mainly includes silicon (Si), nitrogen (N) and carbon (C). In another embodiment, based on the reaction gas in the chemical vapor deposition process and requirements of the product, the first bonding layer 201 may be doped with at least one of silicon (Si), nitrogen (N), oxygen (O), hydrogen (H), phosphours (P) and fluorine (F), etc. The material of the first bonding layer 201 may be silicon nitride doped with carbon, silicon oxynitride doped with carbon or silicon oxide doped with nitrogen and carbon, etc. Because the first bonding layer 201 includes carbon, the density of the first bonding layer 201 is lower, and thus, if the first bonding layer 201 is directly formed on the surface of the first substrate 100, adhesive force between the first bonding layer 201 and the surface of the first substrate 100 is weaker. In the embodiment of the present invention, the first adhesive layer 202 with higher density is formed between the first bonding layer 201 and the first substrate 100, such that the adhesive forces between each two layers may be enhanced.

By controlling the forming process parameters of the first bonding layer 201 and the first adhesive layer 202, the concentrations of each material component in the first bonding layer 201 and the first adhesive layer 202 may be adjusted, so as to adjust the adhesive force between material layers and the dielectric constant of the first bonding layer 201.

The carbon (C) in the first bonding layer 201 can effectively improve the bonding force between the first bonding layer 201 and another bonding layer during a bonding process. If the concentration of the carbon (C) is higher, the bonding force between the first bonding layer 201 and another bonding layer is greater. In an embodiment, the atomic concentration of the carbon (C) in the first bonding layer 201 is greater than 0 and less than 50%. In another embodiment, the atomic concentration of the carbon (C) in the first bonding layer 201 is greater than 35%.

Since the adhesive force between the different material layers is correlated to the material components of two sides of the interface, when the material components are closer, the adhesive force is stronger. In order to further enhance the adhesive force between the first adhesive layer 202 and the first component layer 102, the concentration of the material component in the first adhesive layer 202 may be changed gradually depending on the thickness, such that the material components of two sides of the interface between the first component layer 102 and the first adhesive layer 202 are closer. In an embodiment, the atomic concentration of silicon (Si) in the first adhesive layer 202 is gradually changed as the thickness of the first adhesive layer 202 is increased. In another embodiment, according to the difference of the material of the surface of the first component layer 102, the concentration of other component in the first adhesive layer 202 may be changed depending on the thickness of the first adhesive layer 202. In another embodiment, it is also possible to keep the atomic concentration of each element in the first adhesive layer 202 unchanged at different thickness location, such that the first adhesive layer 202 has uniform atomic concentration.

In order to further enhance the adhesive force between the first adhesive layer 202 and the first bonding layer 201, the concentration of the material component in the first bonding layer 201 may be changed gradually depending on the thickness, such that the material components of two sides of the interface between the first bonding layer 201 and the first adhesive layer 202 are closer. In an embodiment, as the thickness of the first bonding layer 201 is increased, the atomic concentration of carbon (C) in the first bonding layer 201 is gradually increased as the thickness of the first bonding layer 201 is increased. In another embodiment, the atomic concentration of carbon (C) in the first bonding layer 201 may be gradually deceased as the thickness of the first bonding layer 201 is increased, or the atomic concentration of carbon (C) in the first bonding layer 201 may be gradually increased and then gradually decreased as the thickness of the first bonding layer 201 is increased. In another embodiment, the atomic concentration of each element in the first bonding layer 201 is unchanged at different thickness location, such that the first bonding layer 201 has uniform atomic concentration.

In order to make the first adhesive layer 202 have higher density, the thickness of the first adhesive layer 202 cannot be too thick. In an embodiment, the thickness of the first adhesive layer 202 ranges from 30 Å to 100 Å.

The thickness of the first bonding layer 201 is greater than the thickness of the first adhesive layer 202, so as to ensure that the first bonding layer 201 has enough bonding thickness when bonding the first bonding layer 201 and another bonding layer. In an embodiment, the thickness of the first bonding layer 201 is greater than 100 Å.

In another embodiment, the first bonding layer 201 may further include two or more stacked sub-bonding layers, and the materials of the different sub-bonding layers may be a same or different.

Referring to FIG. 4, FIG. 4 is a structure schematic diagram of the semiconductor structure according to another embodiment of the present invention.

In this embodiment, the semiconductor structure further includes the second substrate 300, wherein the second adhesive layer 402 and the second bonding layer 401 disposed on the surface of the second adhesive layer 402 are formed on the second substrate 300; the surface of the second bonding layer 401 and the surface of the first bonding layer 201 face each other for being bonded.

The second substrate 300 includes the second semiconductor substrate 301 and the second component layer 302 disposed on the surface of the second semiconductor substrate 301.

The material of second adhesive layer 402 is the dielectric material of which the density is greater than the density of the second bonding layer 401. The second adhesive layer 402 may include at least one of silicon nitride, silicon oxynitride and silicon oxide, and furthermore, based on reaction gas in the chemical vapor deposition process and requirements of the product, the second adhesive layer 402 may be doped with at least one of oxygen (O), hydrogen (H), phosphours (P) and fluorine (F), etc.

The second bonding layer 401 includes the dielectric material including carbon (C), and the second bonding layer 401 in an embodiment mainly includes silicon (Si), nitrogen (N) and carbon (C). In another embodiment, based on reaction gas in the chemical vapor deposition process and requirements of the product, the second bonding layer 401 may be doped with at least one of silicon (Si), nitrogen (N), oxygen (O), hydrogen (H), phosphours (P) and fluorine (F), etc.

The materials and structures of the second adhesive layer 402 and the second bonding layer 401 may be similar to those in the description of the first adhesive layer 202 and the first bonding layer 201 in the above embodiments, and will not be redundantly described. In an embodiment, the second adhesive layer 402 and the first adhesive layer 202 have the same material and structure; the second bonding layer 401 and the first bonding layer 201 have the same material and structure. In an embodiment, the thickness of the second adhesive layer 402 ranges from 30 Å to 100 Å, and the thickness of the second bonding layer 401 is greater than 100 Å.

The second bonding layer 401 and the first bonding layer 201 include carbon (C), such that more silicon-oxygen (Si—O) bonds may be formed at the bonding interface to generate stronger bonging force. In an embodiment, the bonding force between the second bonding layer 401 and the first bonding layer 201 is greater than 1.7 $J/M^2$.

In another embodiment, the semiconductor structure may include three or more substrates, wherein the adjacent substrates are bonded to each other through the adhesive layer and the bonding layer in the embodiment of the present invention.

Referring to FIG. 5, FIG. 5 is a structure schematic diagram of the semiconductor structure according to another embodiment of the present invention.

In this embodiment, the semiconductor structure further includes: the first bonding pad 501 extending through the first bonding layer 201 and the first adhesive layer 202; and the second bonding pad 502 extending through the second bonding layer 401 and the second adhesive layer 402; wherein the surface of the second bonding layer 401 and the surface of the first bonding layer 201 face each other for being bonded, and the first bonding pad 501 and the second bonding pad 502 are correspondingly bonded and connected to each other.

The first bonding pad 501 and the second bonding pad 502 may be respectively connected to the semiconductor components or the metal interconnection layers in the first component layer 102 and the second component layer 302.

The first bonding pad 501 and the second bonding pad 502 may include metal material such as copper (Cu), tungsten (W), etc. The first bonding layer 201 and the second bonding layer 401 include carbon (C) which can block the diffusion of the material of the first bonding pad 501 and the second bonding pad 502 at the bonding interface and improve the performance of the semiconductor structure.

Referring to FIG. 6, in an embodiment of the present invention, the semiconductor structure further includes the third substrate 600, the third adhesive layer 702 disposed on the surface of one side of the third substrate 600, the third bonding layer 701 disposed on the surface of the third adhesive layer 702, the fourth adhesive layer 802 disposed on the surface of another side opposite to the aforementioned side of the third substrate 600, and the fourth bonding layer 801 disposed on the surface of fourth adhesive layer 802; wherein the surface of the third bonding layer 701 and the surface of the first bonding layer 201 face each other for being bonded, and the surface of the fourth bonding layer 801 and the surface of the second bonding layer 401 face each other for being bonded, so as to form a three-layer bonding structure.

The materials and structures of the third adhesive layer 702 and the fourth adhesive layer 802 may be similar to the material and structure of the first adhesive layer 202 in the above embodiments, and will not be redundantly described. The materials and structures of the third bonding layer 701 and the fourth bonding layer 801 may be similar to the material and structure of the first bonding layer 201 in the above embodiments, and will not be redundantly described.

In this embodiment, the semiconductor structure further includes the third bonding pad 703 extending through the third bonding layer 701 and the third adhesive layer, and the fourth bonding pad 803 extending through the fourth bonding layer 801 and the fourth adhesive layer 802, wherein the third bonding pad 703 and the first bonding pad 501 are bonded and connected to each other, and the fourth bonding pad 803 and the second bonding pad 502 are bonded and connected to each other.

In another embodiment, the semiconductor structure may be a bonding structure having four or more layers.

The above only describes the preferred embodiments of the present invention, it should be noted that those skilled in the art can make several improvements, modifications and alterations without departing from the principles of the present invention, and it should be considered that these improvements, modifications and alterations are in the scope of protection of the present invention.

What is claimed is:

1. A semiconductor structure, comprising:
    a first substrate;
    a first adhesive layer disposed on a surface of the first substrate; and
    a first bonding layer disposed on a surface of the first adhesive layer, wherein a density of the first adhesive layer is greater than a density of the first bonding layer.

2. The semiconductor structure of claim 1, wherein the first bonding layer comprises a dielectric material comprising carbon (C).

3. The semiconductor structure of claim 2, wherein the first bonding layer further comprises silicon (Si) and nitrogen (N).

4. The semiconductor structure of claim 1, wherein the first adhesive layer comprises at least one of silicon nitride, silicon oxynitride and silicon oxide.

5. The semiconductor structure of claim 1, wherein a thickness of the first adhesive layer ranges from 30 Å to 100 Å.

6. The semiconductor structure of claim 2, wherein an atomic concentration of the carbon is uniform in the first bonding layer, or the atomic concentration of the carbon is increased as a thickness of the first bonding layer is increased.

7. The semiconductor structure of claim 1, further comprising a second substrate, wherein a second adhesive layer and a second bonding layer disposed on a surface of the second adhesive layer are formed on a surface of the second substrate, a density of the second adhesive layer is greater than a density of the second bonding layer, and a surface of the second bonding layer and a surface of the first bonding layer face each other for being bonded.

8. The semiconductor structure of claim 7, wherein the second bonding layer and the first bonding layer have a same material, and the second adhesive layer and the first adhesive layer have a same material.

9. The semiconductor structure of claim 7, wherein a thickness of the second adhesive layer ranges from 30 Å to 100 Å.

10. The semiconductor structure of claim 7, further comprising:
    a first bonding pad extending through the first bonding layer and the first adhesive layer; and
    a second bonding pad extending through the second bonding layer and the second adhesive layer;
    wherein the first bonding pad and the second bonding pad are correspondingly bonded and connected to each other.

11. A forming method of a semiconductor structure, comprising:
    providing a first substrate;
    forming a first adhesive layer on a surface of the first substrate;
    performing a plasma bombardment process to the first adhesive layer, so as to enhance a density of the first adhesive layer; and
    forming a first bonding layer on a surface of the first adhesive layer, wherein the density of the first adhesive layer is greater than a density of the first bonding layer.

12. The forming method of the semiconductor structure of claim 11, wherein the first adhesive layer has hydrogen (H) bonds before performing the plasma bombardment process, and a plasma containing nitrogen (N) is used for bombarding to decrease the hydrogen bonds of the first adhesive layer in the step of performing the plasma bombardment process.

13. The forming method of the semiconductor structure of claim 11, wherein the first bonding layer comprises a dielectric material comprising carbon.

14. The forming method of the semiconductor structure of claim 13, wherein the first bonding layer further comprises silicon and nitrogen.

15. The forming method of the semiconductor structure of claim 11, wherein the first adhesive layer comprises at least one of silicon nitride, silicon oxynitride and silicon oxide.

16. The forming method of the semiconductor structure of claim 11, wherein a thickness of the first adhesive layer ranges from 30 Å to 100 Å.

* * * * *